US010477695B2

(12) United States Patent
Utsumi et al.

(10) Patent No.: US 10,477,695 B2
(45) Date of Patent: Nov. 12, 2019

(54) DRYING APPARATUS

(71) Applicant: C. Uyemura & Co., Ltd., Osaka (JP)

(72) Inventors: Masayuki Utsumi, Osaka (JP); Tomoji Okuda, Osaka (JP); Yutaka Nishinaka, Osaka (JP); Daisuke Matsuyama, Osaka (JP)

(73) Assignee: C. UYEMURA & CO., LTD., Osaka (JP)

( * ) Notice: Subject to any disclaimer, the term of this patent is extended or adjusted under 35 U.S.C. 154(b) by 0 days.

(21) Appl. No.: 15/785,938

(22) Filed: Oct. 17, 2017

(65) Prior Publication Data

US 2018/0110128 A1    Apr. 19, 2018

(30) Foreign Application Priority Data

Oct. 18, 2016   (JP) ................. 2016-204473

(51) Int. Cl.
| | |
|---|---|
| *H05K 3/22* | (2006.01) |
| *F26B 3/30* | (2006.01) |
| *F26B 15/14* | (2006.01) |
| *F26B 21/00* | (2006.01) |

(52) U.S. Cl.
CPC ............. *H05K 3/227* (2013.01); *F26B 3/30* (2013.01); *F26B 15/14* (2013.01); *F26B 21/004* (2013.01); *H05K 2203/08* (2013.01); *H05K 2203/1105* (2013.01); *H05K 2203/1518* (2013.01)

(58) Field of Classification Search
CPC .............. H05K 3/227; H05K 2203/08; H05K 2203/105; F26B 3/30; F26B 15/14; F26B 21/004

USPC .......................................... 34/523
See application file for complete search history.

(56) References Cited

U.S. PATENT DOCUMENTS

| | | | | |
|---|---|---|---|---|
| 3,680,568 A * | 8/1972 | James | ................. | B29C 35/04 134/63 |
| 5,608,974 A * | 3/1997 | Tanaka | ................. | F26B 5/04 118/58 |
| 5,671,544 A * | 9/1997 | Yokomizo | ........... | F26B 21/145 34/169 |
| 5,882,168 A * | 3/1999 | Thompson | ........ | H01L 21/67173 414/416.01 |
| 5,950,643 A * | 9/1999 | Miyazaki | ........... | B28D 5/0076 134/201 |

(Continued)

FOREIGN PATENT DOCUMENTS

| | | |
|---|---|---|
| JP | 61-121976 | 6/1986 |
| JP | 05-248763 | 9/1993 |

(Continued)

OTHER PUBLICATIONS

Japanese Office Action issued Apr. 16, 2019 in corresponding Japanese Patent Application No. 2016-204473 with English translation.

*Primary Examiner* — Stephen M Gravini
(74) *Attorney, Agent, or Firm* — Wenderoth, Lind & Ponack, L.L.P.

(57) ABSTRACT

A drying apparatus of the present invention includes a drying tank for performing drying processing of a workpiece, a fixture for the workpiece, heating means opposed to a front surface of the workpiece, and heating means opposed to a back surface of the workpiece, wherein each heating means is inclined from a horizontal line in its longitudinal direction.

13 Claims, 10 Drawing Sheets

(56) References Cited

U.S. PATENT DOCUMENTS

| | | | | |
|---|---|---|---|---|
| 6,108,932 A * | 8/2000 | Chai | ............... | H01L 21/67034 34/245 |
| 6,125,862 A * | 10/2000 | Ishikawa | ............... | B08B 3/04 134/105 |
| 6,158,141 A * | 12/2000 | Asada | ............... | H01L 21/67034 134/25.4 |
| 6,920,704 B1 * | 7/2005 | Silverbrook | ............... | B41J 11/002 101/483 |
| 6,944,970 B2 * | 9/2005 | Silverbrook | ............... | B41J 11/002 101/389.1 |
| 7,377,053 B1 * | 5/2008 | Maeda | ............... | H01L 21/67028 134/21 |
| 7,832,953 B2 * | 11/2010 | Silverbrook | ............... | B41J 11/002 347/102 |
| 7,980,000 B2 * | 7/2011 | Lewis | ............... | H01L 21/67028 118/500 |
| 8,205,352 B2 * | 6/2012 | Lewis | ............... | H01L 21/67028 118/500 |
| 8,756,826 B2 * | 6/2014 | Gibbel | ............... | F26B 5/042 34/403 |
| 8,826,558 B2 * | 9/2014 | Priebe | ............... | F26B 3/22 118/258 |
| 9,279,616 B2 * | 3/2016 | Gibbel | ............... | F26B 5/042 |
| 9,459,346 B2 * | 10/2016 | Einziger | ............... | H05B 6/64 |
| 10,197,333 B2 * | 2/2019 | Kim | ............... | F26B 21/145 |
| 2017/0115060 A1 * | 4/2017 | Ashourian | ............... | B65G 19/10 |
| 2018/0110128 A1 * | 4/2018 | Utsumi | ............... | H05K 3/227 |

FOREIGN PATENT DOCUMENTS

| | | | | |
|---|---|---|---|---|
| JP | 05-090293 | | 12/1993 | |
| JP | 6-6014 | | 1/1994 | |
| JP | 10-160347 | | 6/1998 | |
| JP | 2004-265908 | | 9/2004 | |
| JP | 2009-088442 | | 4/2009 | |
| JP | 2018066500 A | * | 4/2018 | ............ H05K 3/227 |

* cited by examiner

DRYING APPARATUS

BACKGROUND OF THE INVENTION

(1) Field of the Invention

The present invention relates to a drying apparatus, and more particularly to a drying apparatus for drying a workpiece such as a printed board subjected to cleaning processing.

(2) Description of Related Art

In a process of manufacturing a workpiece such as a printed circuit board, a foreign matter or the like adhered in a pretreatment process such as desmear processing is removed by cleaning processing such as water washing process, and then drying processing is applied to the workpiece. If liquid adhering to a surface of the workpiece is not sufficiently removed, the liquid remaining may cause a defect. While extending drying time enables the liquid to be sufficiently removed and dried, from a viewpoint of improving production efficiency, the drying processing is required to be efficiently performed in a time as short as possible.

For example, JP-A-6-006014 (Patent Document 1) discloses a drying apparatus that performs drying processing while horizontally moving a printed circuit board in a state of vertically suspending the printed circuit. This configuration enables the drying processing to be efficiently performed as compared with when the printed circuit board is horizontally conveyed in a state of being horizontally held.

SUMMARY OP THE INVENTION

Even when drying processing is applied to a workpiece such as a printed circuit board while the workpiece is horizontally moved in a state of being vertically suspended as described in Patent Document 1, the temperature of the workpiece decreases with distance from heating means (heat source) used for the drying processing to cause in-plane temperature difference and uneven drying.

The present invention is made in light of the above-mentioned circumstances, and an object thereof is to provide a drying apparatus capable of reducing drying failure such as uneven drying of a workpiece.

A drying apparatus of the present invention, capable of solving the above-mentioned problems, includes a drying tank for performing drying processing of a workpiece, a fixture for the workpiece, heating means opposed to a front surface of the workpiece, and heating means opposed to a back surface of the workpiece, wherein each heating means is inclined from a horizontal line in its longitudinal direction.

There is a preferable embodiment in which gas injection means opposed to the front surface of the workpiece and gas injection means opposed to the back surface of the workpiece are provided, wherein a nozzle hole of each gas injection means is inclined obliquely downward.

In addition, the drying tank may include a conveying mechanism of the fixture, an exhaust port provided in a bottom surface thereof, a gas straightening plate that is provided above the exhaust port to allow gas injected through the nozzle hole to strike on the gas straightening plate, and a surface that faces the workpiece may have a curved shape being convex upward, all of which are preferable embodiments.

It is also preferable that the gas injection means has a lifting mechanism.

The drying apparatus of the present invention further includes a front tank provided on an inlet side of the drying tank, and a rear tank provided on an outlet side of the drying tank, wherein the front tank and the rear tank each have gas injection means opposed to the front surface of the workpiece and gas injection means opposed to the back surface of the workpiece, and the gas injection means is provided at least at one of a position facing an upper portion of the workpiece and a position facing a lower portion thereof.

It is also preferable that the drying apparatus of the present invention further includes a reserve heating tank provided on an inlet side of the front tank, and that the reserve heating tank has heated liquid injection means.

According to the drying apparatus of the present invention, the heating means is provided in the drying tank so as to incline from the horizontal line in its longitudinal direction, so that uneven drying of the workpiece in the vertical direction can be reduced.

DETAILED DESCRIPTION OF THE PREFERRED EMBODIMENTS

The best mode for practicing the present invention will be described in detail below with reference to the drawings, but the present invention is not limited to the following embodiments.

Figure 1:
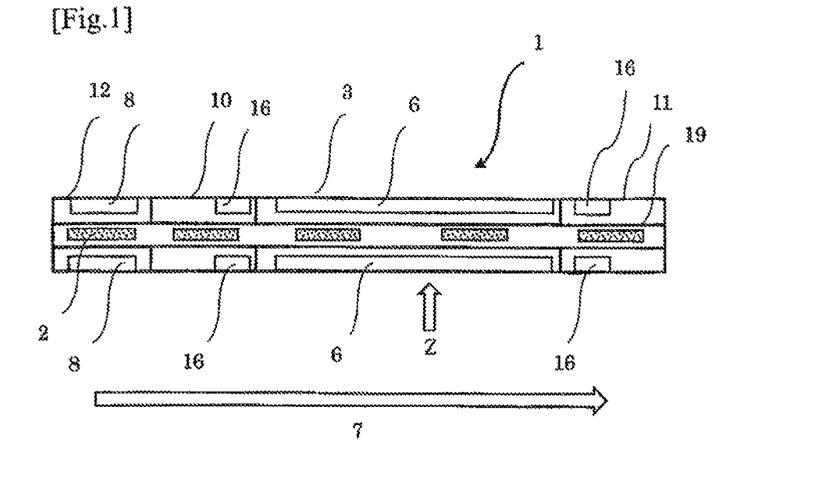
FIG. 1 is a plan view of a drying apparatus according to an embodiment of the present invention as viewed from above.
Figure 2:
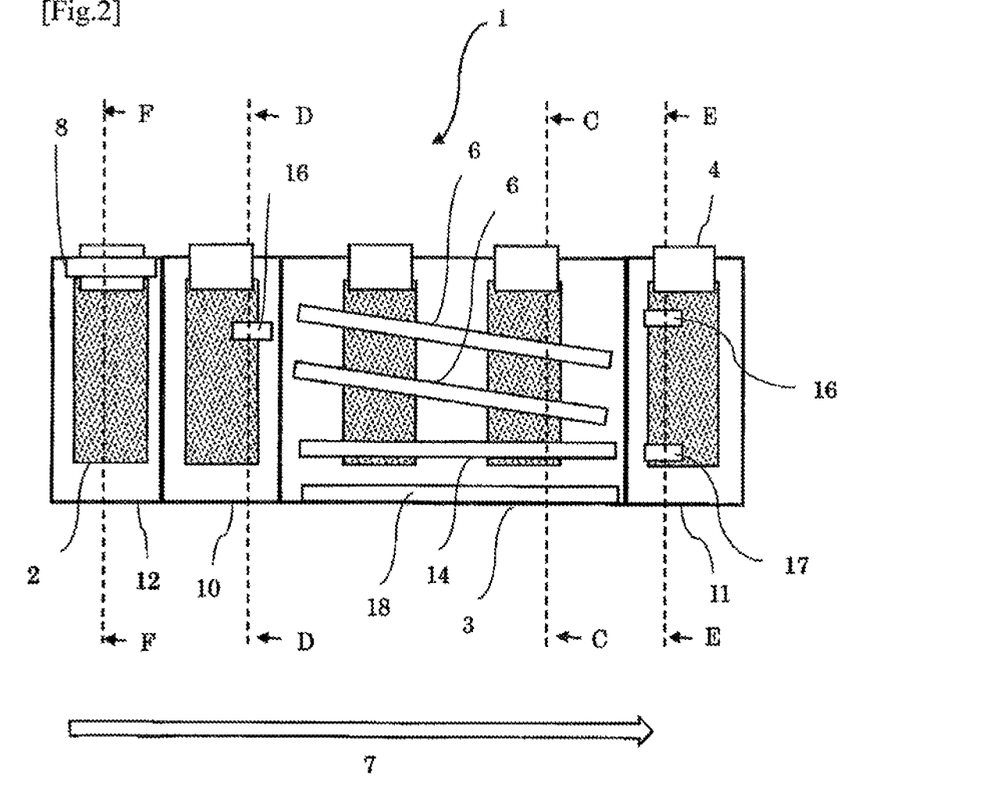
FIG. 2 is a side view of the drying apparatus of FIG. 1 as viewed from the direction of an arrow Z.
Figure 3:
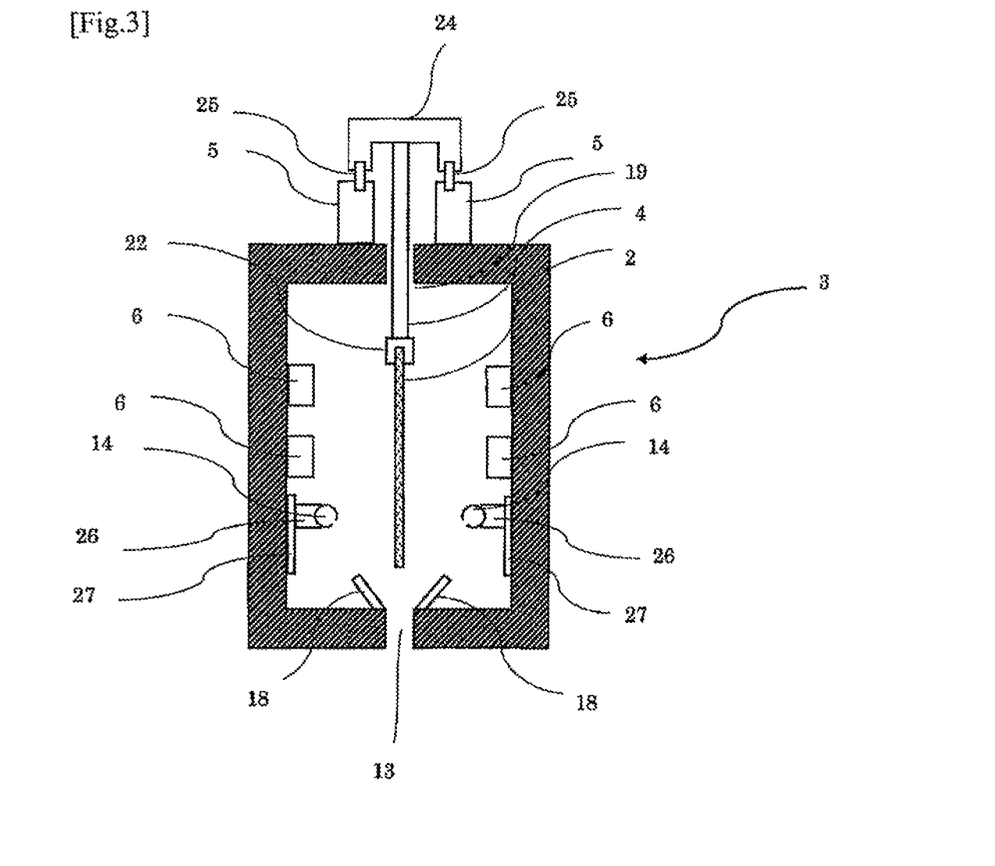
FIG. 3 is a sectional view of a drying tank of FIG. 2 as viewed from the direction of an arrow C.

With reference to the drawings, a structure of a drying apparatus 1 of the present invention will be described. FIG. 1 is a plan view of a drying apparatus according to an embodiment of the present invention as viewed from above. FIG. 2 is a side view of the drying apparatus of FIG. 1 as viewed from the direction of an arrow Z. FIG. 3 is a sectional view of a drying tank of FIG. 2 as viewed from the direction of an arrow C. In FIG. 1, a fixture and a conveying mechanism are eliminated. In FIG. 2, the conveying mechanism is eliminated.

As illustrated in FIG. 1, the drying apparatus 1 includes a reserve heating tank 12, a front tank 10, a drying tank 3, and a rear tank 11 in order along a conveying direction 7 of a workpiece 2, and required processing is applied to the workpiece 2, passing through each tank in this order. As illustrated in FIG. 3, each tank is provided with a cutout 19 that forms a passage for a fixture 4.

The drying apparatus 1 includes the fixture 4 that holds and conveys the workpiece 2, and a conveying mechanism for conveying the fixture 4 into each tank. The workpiece 2 is held by the fixture 4 such that a front surface and back surface of the workpiece 2 face a side surface of the drying apparatus 1, i.e., a surface orthogonal to the conveying direction 7 of the workpiece 2.

The fixture 4 holds an upper portion (one side) of the workpiece 2 with a holding part 22 such as a clamp. As illustrated in FIG. 3, the fixture 4 is held by the fixture connecting part 24 through the cutout 19 in midair in the drying tank. For the fixture 4, any known fixture can be used as long as it can hold the workpiece 2, and for example, a plurality of sides of the workpiece 2 may be held by a hanger used for conveying a printed circuit board or the like, or by a fixture in the shape of a frame. The workpiece may be a plate-like workpiece, such as various resin substrates, glass substrates, metal substrates, and ceramic substrates, for example. The workpiece may have low flexibility like a rigid substrate, or may have high flexibility like a flexible substrate. When the workpiece is in the shape of a plate, thickness of the order of several millimeters to submicron sizes is available.

The conveying mechanism illustrated in FIG. 3 includes a guide rail 5, the fixture connecting part 24, and a conveying roller 25. In the conveying mechanism, the conveying roller 25 for moving on the guide rail 5 is attached to a bottom portion of the fixture connecting part 24, and is driven by driving means such as a motor (not illustrated). The guide rail 5 is fixed to an upper portion of the drying apparatus. Various kinds of well-known fixture conveying means can be used for the conveying mechanism.

A partition member for dividing each tank may be provided between each tank, or may not be provided. From a viewpoint of efficiently drying the workpiece 2, it is desirable to provide no partition member to reduce drying time by eliminating time loss due to opening and closing of the partition member.

Inside the drying tank 3 illustrated in FIG. 3, there are provided heating means 6 opposed to a front surface of the workpiece 2 being conveyed, and heating means 6 opposed to a back surface of the workpiece 2 6, to apply drying processing to the workpiece 2. In the present invention, the same processing is applied to the front surface and back surface of the workpiece 2, so that the front surface and the back surface may be either surface.

As illustrated in FIG. 2, the heating means 6 provided so as to face one surface of the workpiece 2 is provided so as to incline from the horizontal line in its longitudinal direction. Accordingly, a height position of the heating means 6, more specifically of the workpiece 2 facing the heat source, changes with movement of the workpiece 2, so that in-plane temperature distribution difference of the workpiece 2 decreases. As a result, uneven drying can be reduced. When the heating means 6 is preferably inclined such that its front side in the conveying direction 7 of the workpiece 2 is on an upper side of the horizontal line, the workpiece 2 can be efficiently dried while droplets of liquid are removed in order from an upper side of the workpiece 2.

The heating means 6 is a conductive member that can be used for heating by a radiant heat method, such as carbon or ceramic. While a shape of the heating means 6 is not particularly limited, the heating means 6 may be in a rod-like elongated shape to be able to efficiently heat the workpiece 2 being conveyed. When a rod-shaped conductive member is used, the rod-shaped conductive member is provided at its both ends with respective electrodes, and then is energized to be heated to generate far infrared rays.

In the illustrated example, the number of the installed heating means 6 is two per side, but is not limited thereto, and thus may be appropriately determined according to the size of a workpiece to enable the workpiece to be sufficiently dried. The number of heating means 6 on each of the front and back surfaces of the workpiece 2 may be identical or different. The shape of the heating means 6 is not particularly limited as long as the heating means 6 has an elongated shape and is sufficiently long to dry the workpiece 2. In FIG. 2, the heating means 6 extends from an inlet side of the drying tank 3 to an outlet side thereof, but may be divided into a plurality of parts.

As illustrated in FIG. 3, inside the drying tank 3, there are provided gas injection means 14 opposed to the front surface of the workpiece 2 being conveyed, and gas injection means 14 opposed to the back surface thereof. The gas injection means 14 is attached to a portion below the heating means 6.

Figure 7A:
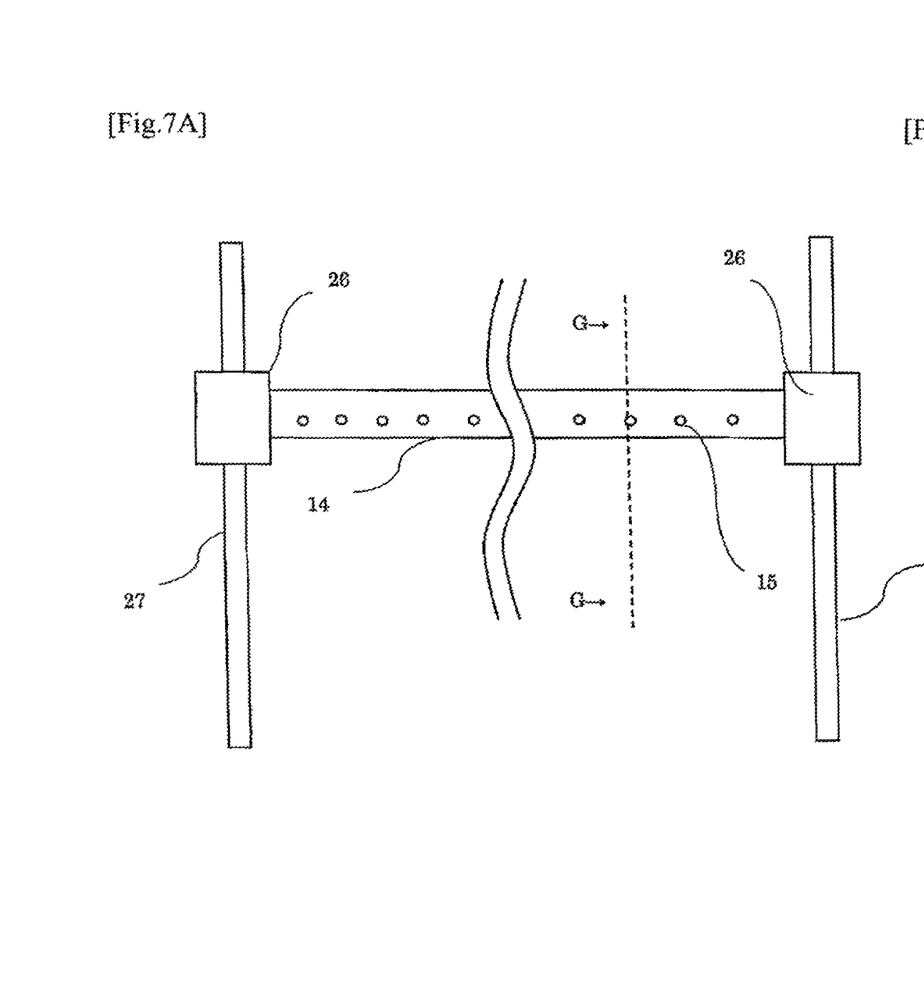
FIG. 7A is a side view of gas injection means illustrated in FIG. 1 as viewed from a workpiece side.
Figure 7B:
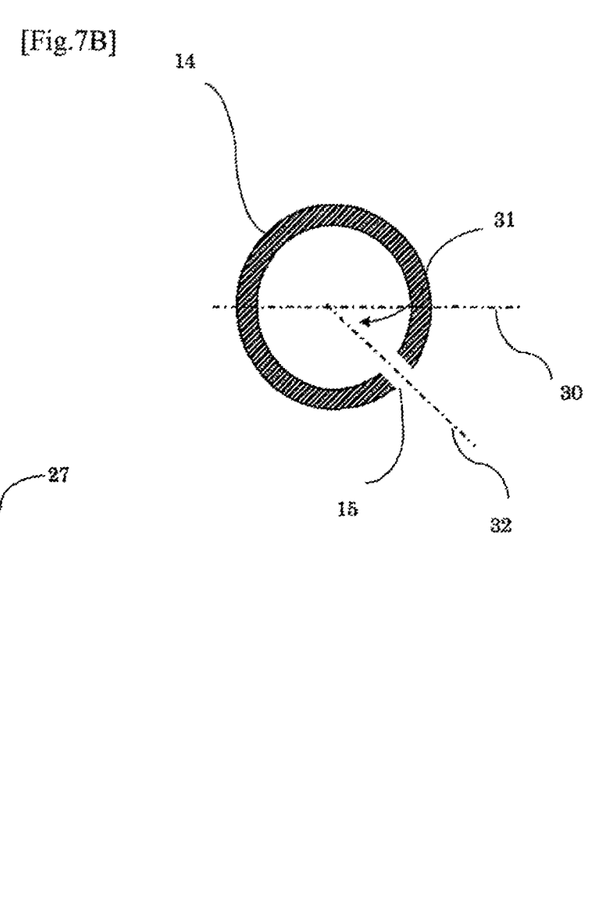
FIG. 7B is a sectional view of the gas injection means as viewed from the direction of an arrow G.

FIG. 7A is a side view of the gas injection means 14 illustrated in FIG. 1 as viewed from a workpiece 2 side. FIG. 7B is a sectional view of the gas injection means 14 as viewed from the direction of an arrow G. The gas injection means 14 is formed of a pipe that is a tubal member having a space thereinside, and has a plurality of nozzle holes 15 that faces obliquely downward and that is disposed at predetermined intervals. The obliquely downward direction is toward the workpiece 2. The gas injection means 14 has a longitudinal direction in the conveying direction 7, and the gas injection means 14 extends from the inlet side of the drying tank 3 to the outlet side thereof as illustrated in FIG. 2, but may be divided into a plurality of parts.

The nozzle hole is provided in the gas injection means 14 such that an installation angle 31 is formed obliquely downward (along a line 32 passing through the center of the nozzle hole) from a horizontal line 30 passing through the center point of a cross section of the gas injection means 14. Gas is injected through the nozzle holes 15 to the workpiece 2 in an obliquely downward direction from the horizontal line, so that an air current strikes on a lower portion of the workpiece 2. As a result, it is possible to reduce sway motion of the workpiece 2, caused by heat convection generated by heating by the heating means 6, as well as to remove droplets of liquid adhering to a lower end portion of the workpiece 2.

In FIG. 7B, a cross section of the gas injection means 14 is circular, but another shape such as square may be adopted, and the nozzle hole 15 may be formed in a shape other than a circle. In FIG. 7A, the plurality of nozzle holes 15 is provided in a tubal member, but slit-shaped cutouts may be provided in the tubal member in its longitudinal direction to form gas discharge ports. Alternatively, a plurality of air nozzles each having a nozzle hole, to each of which gas is independently supplied, may be disposed on a plate-like member serving as a base.

The gas injection means 14 includes a lifting mechanism. The lifting mechanism moves up and down the gas injection means 14 to enable an injection position of gas to be adjusted. As illustrated in FIG. 7A, the lifting mechanisms each provided at both ends of the gas injection means 14 in its longitudinal direction include a lifting support part 26, a lifting rail 27, and a lifting roller (not illustrated) provided in the lifting support part 26. The lifting roller for moving along the lifting rail 27 is attached inside the lifting support part 26, and may be driven by a motor (not illustrated) or the like. The lifting support part 26 is moved along the lifting rail 27 when being moved up and down, so that smooth lifting and lowering can be achieved, and thus the gas injection means 14 can be accurately moved to a predetermined position in a short time while being maintained in a horizontal state. It does not matter whether the lifting rail 27 is brought into contact with an inner wall of the drying tank 3. The lifting rail 27 may be attached to the inner wall of the drying tank 3, or the lifting rail 27 may be attached to a support strut with both ends each of which is connected to the corresponding one of a ceiling surface and bottom surface of the drying tank 3.

The bottom surface of the drying tank 3 is provided with the cutout 19 serving as an exhaust port 13. Gas injected from the gas injection means 14 is discharged to the outside of the drying tank 3 through the exhaust port 13. The exhaust port 13 is provided so as to be positioned directly under the workpiece 2. This reduces sway motion of the workpiece 2 caused by an air current discharged through the exhaust port 13. The exhaust port 13 has a longitudinal direction identical to the conveying direction 7, and has a length that is approximately identical to that of the gas injection means 14. When the exhaust port 13 has a length less than that of the gas injection means 14 in its longitudinal direction, sway motion of the workpiece 2 may be caused by an air current, and thus it is preferable that the exhaust port 13 is formed to have a length more than that of the gas injection means 14.

Figure 8:
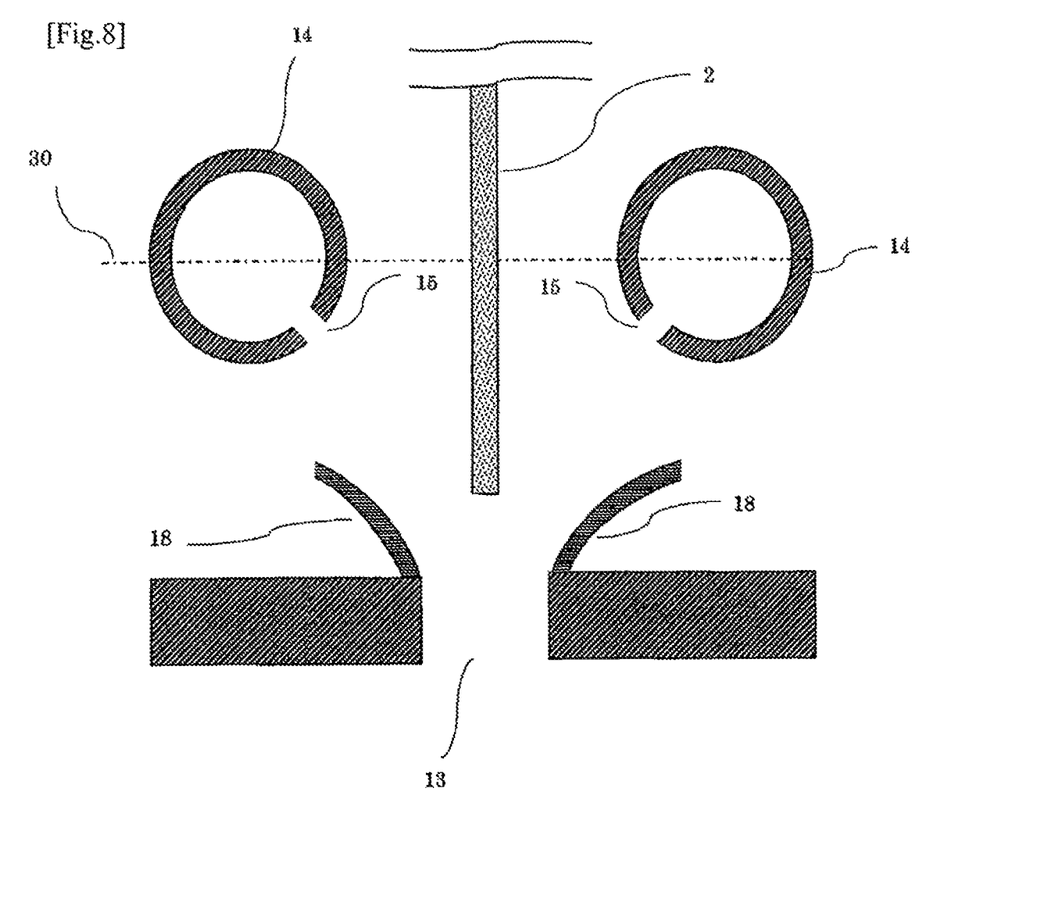
FIG. 8 is an enlarged view of the vicinity of an exhaust port of the drying tank of FIG. 3, and is a sectional view illustrating another embodiment of a gas straightening plate.

Above the exhaust port 13, a gas straightening plate 18 is provided. Specifically, as illustrated in FIG. 3, gas straightening plates 18 on which gas injected from the gas injection means 14 provided on the front surface and back surface of the workpiece 2 strikes are provided on the bottom surface above the exhaust port 13 so as to face each other across the exhaust port 13. Each of the gas straightening plates 18 is provided so as to have a longitudinal direction identical to that of the exhaust port 13, as well as a length identical to that of the exhaust port 13. The gas straightening plate 18 is provided to incline in a direction away from the workpiece 2, and an angle formed by the bottom surface and the gas straightening plate is preferably between 30° and 80° when the angle in the horizontal state is 0°. A flow of gas injected from the gas injection means 14 is controlled by each of the gas straightening plates 18. As a result, it is possible to prevent sway motion of the workpiece 2 caused by disturbance of an air current. A shape of the gas straightening plate 18 may be a plate-like shape as illustrated in FIG. 3, or a shape in which a surface facing a workpiece is curved to be convex upward as illustrated in FIG. 8, for example. When the gas straightening plate 18 has a curved shape, gas straightening effect is further enhanced.

Next, the front tank 10 provided on the inlet side of the drying tank 3 and the rear tank 11 provided on the outlet side of the drying tank 3 will be described.

Figure 4:
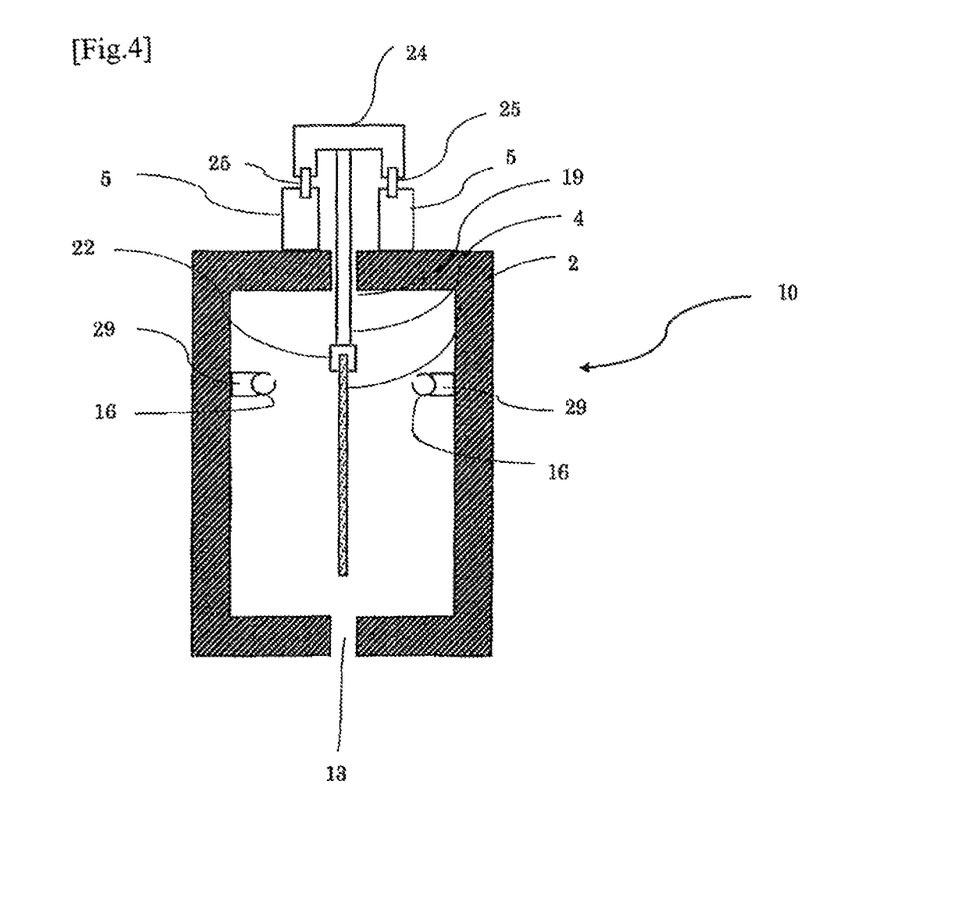
FIG. 4 is a sectional view of a front tank of FIG. 2 as viewed from the direction of an arrow D.
Figure 5:
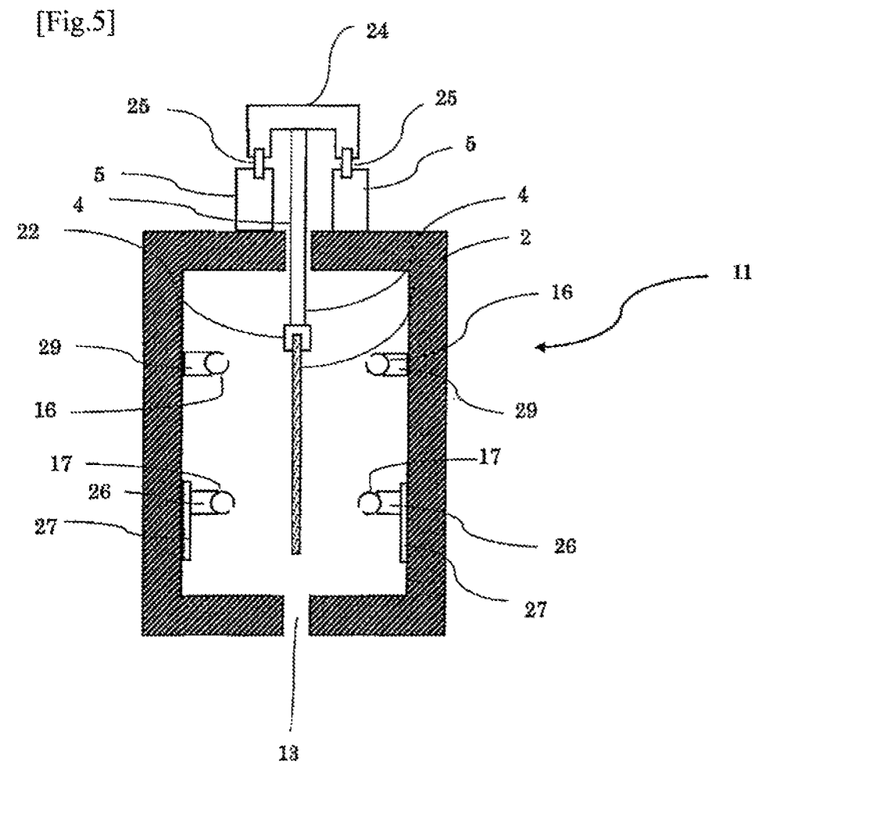
FIG. 5 is a sectional view of a rear tank of FIG. 2 as viewed from the direction of an arrow E.

FIG. 4 is a sectional view of the front tank 10 of FIG. 2 as viewed from the direction of an arrow D. FIG. 5 is a sectional view of the rear tank 11 of FIG. 2 as viewed from the direction of an arrow E. In the front tank 10, liquid adhering to the workpiece 2 is removed as pretreatment of the drying tank 3. In the rear tank 11, the liquid remaining on the workpiece 2 is removed as post-treatment of the drying tank 3. Inside the front tank 10 and the rear tank 11, there are provided gas injection means opposed to the front surface of the workpiece 2, and gas injection means opposed to the back surface of the workpiece 2, to remove liquid. In the front tank 10, the gas injection means is provided at a position (upper gas injection means 16) opposed to an upper portion (upper half) of the workpiece 2. In the rear tank 11, the gas injection means is provided at a position (lower gas injection means 17) opposed to a lower portion (lower half) of the workpiece 2, and the upper gas injection means 16 is further provided. Both the front tank 10 and the rear tank 11 can be provided in any one of or both of the upper gas injection means 16 and the lower gas injection means 17.

Figure 9A:
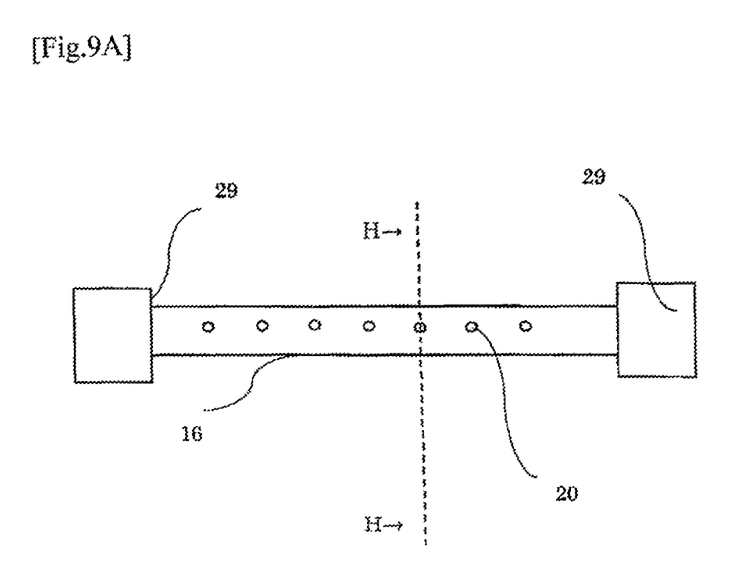
FIG. 9A is a side view of upper gas injection means illustrated in FIG. 1 as viewed from the workpiece side.
Figure 9B:
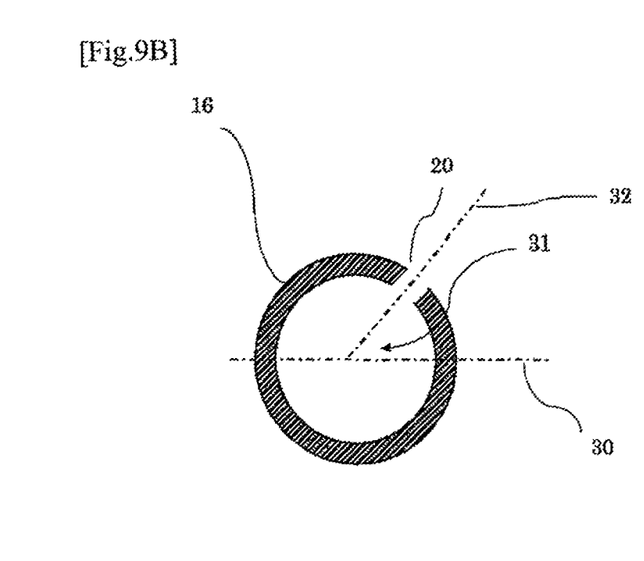
FIG. 9B is a sectional view of the upper gas injection means, and is a view as viewed from the direction of an arrow H.
Figure 10A:
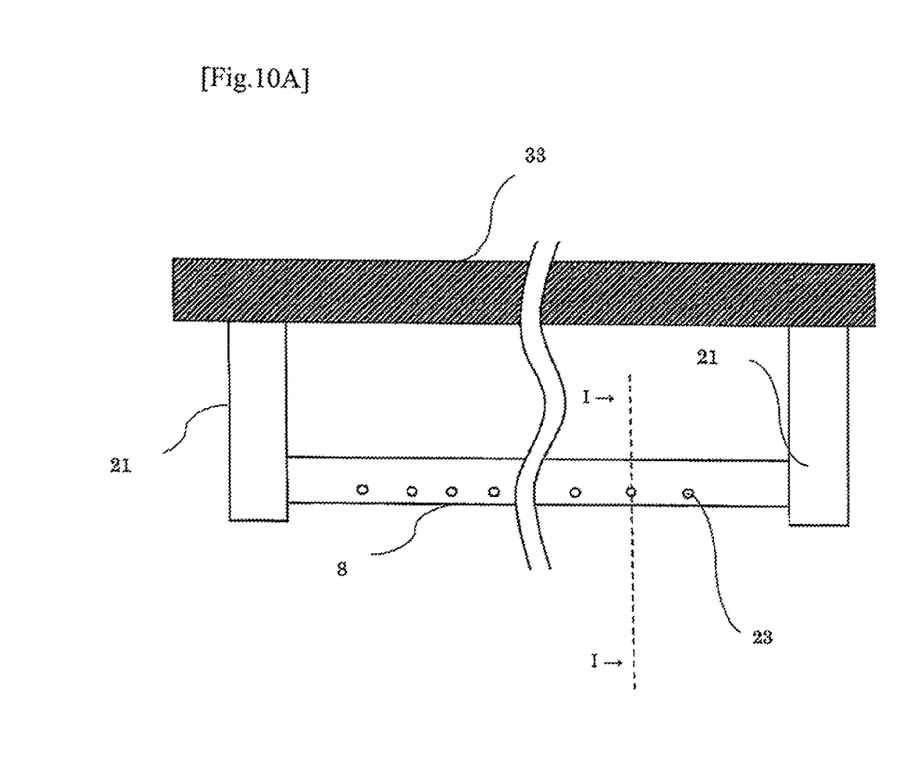
FIG. 10A is a side view of heated liquid injection means illustrated in FIG. 1 as viewed from the workpiece side.
Figure 10B:
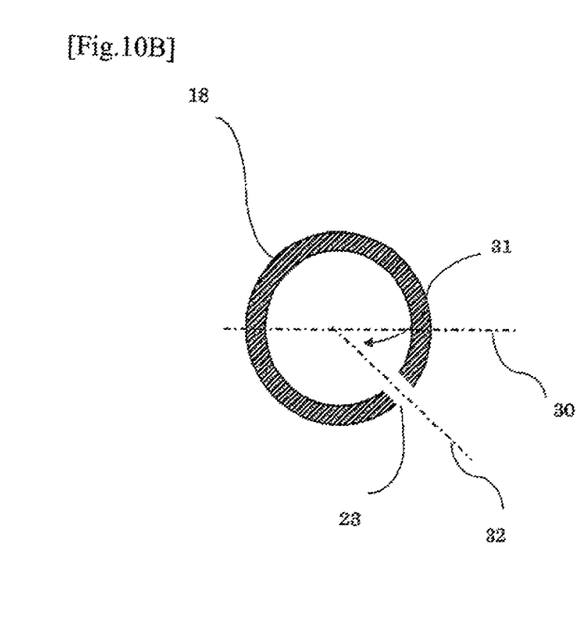
FIG. 10B is a sectional view of the heated liquid injection means, as viewed from the direction of an arrow I.

FIG. 9A is a side view of the upper gas injection means 16 illustrated in FIG. 1 as viewed from the workpiece 2 side. FIG. 9B is a sectional view of the upper gas injection means 16 as viewed from the direction of an arrow H. The upper gas injection means 16 is formed of a pipe that is a tubal member having a space thereinside, and has a plurality of upper nozzle holes 20 disposed at predetermined intervals. The upper gas injection means 16 has a longitudinal direction in the conveying direction 7. The upper gas injection means 16 is held by an upper gas injection means fixing base 29, and the upper gas injection means fixing base 29 is installed fixedly on the wall surface of the front tank. While the upper gas injection means 16 is provided on the outlet side of the front tank 3 as illustrated in FIG. 2, an installation position and a length of the upper gas injection means 16 are not limited as long as the above effects can be obtained.

The upper nozzle hole 20 is provided in the upper gas injection means 16 such that the installation angle 31 is formed obliquely upward (along the line 32 passing through the center of the nozzle hole) from the horizontal line 30 passing through the center point of the upper gas injection means 16. Gas is injected from the upper nozzle holes 20 to the workpiece 2 in an obliquely upward direction from the horizontal line, and an air current strikes on a portion (holding portion) where the workpiece 2 is held by the fixture 4. As a result, it is possible to remove droplets of liquid adhering to the holding portion. The holding portion is difficult to be heated, so that drying efficiency in the drying tank 3 can be improved by removing the droplets of liquid in advance.

The lower gas injection means 17 has the same configuration as that of the gas injection means 14 illustrated in FIGS. 7A and 7B. Accordingly, inside the rear tank 11, gas is injected through a nozzle hole of the lower gas injection means 17 to the workpiece 2 in an obliquely downward direction from the horizontal line, so that an air current strikes on a lower portion of the workpiece 2. As a result, droplets of liquid adhering to the lower end portion of the workpiece 2 can be removed. The lower gas injection means 17 may have lifting means similar to that of the gas injection means 14. While the lower gas injection means 17 is provided on the inlet side of the rear tank 11 as illustrated in FIG. 2, an installation position and a length of the lower gas injection means 17 are not limited as long as the above effects can be obtained.

When the lower gas injection means 17 is provided, it is preferable to provide an exhaust port 13 as well as a gas straightening plate as with FIG. 3.

Subsequently, the reserve heating tank 12 provided on the inlet side of the front tank 10 will be described.

Figure 6:
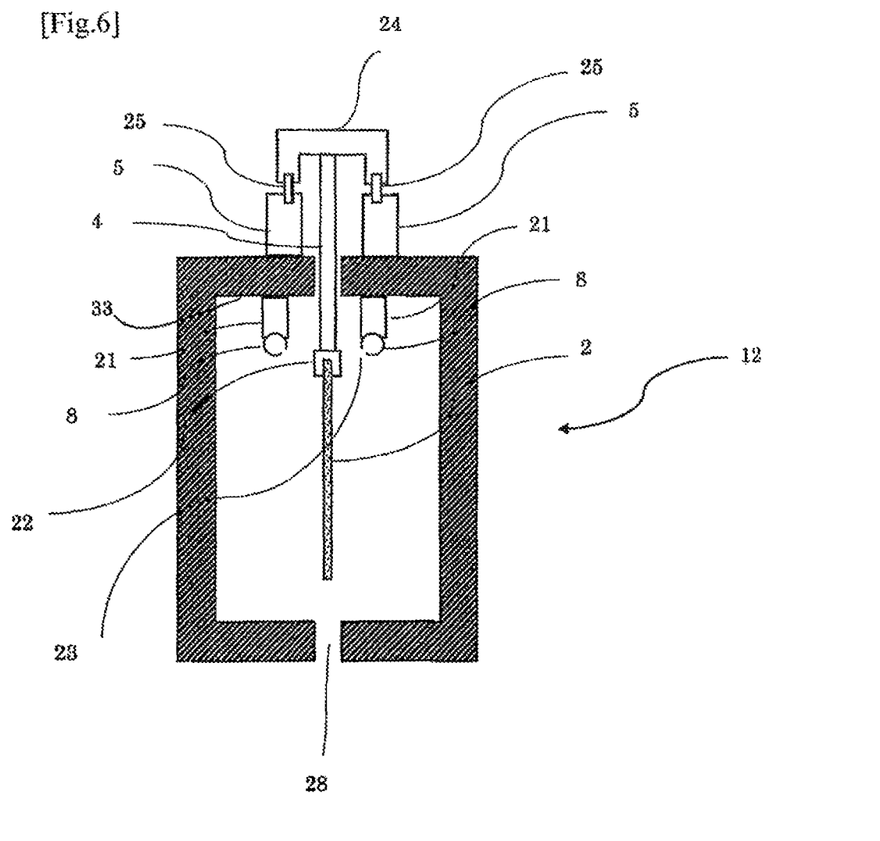
FIG. 6 is a sectional view of a reserve heating tank of FIG. 2 as viewed from the direction of an arrow F.

FIG. 6 is a sectional view of the reserve heating tank 12 of FIG. 2 as viewed from the direction of an arrow F. The reserve heating tank 12 includes heated liquid injection means 8 thereinside to perform preheating treatment of the workpiece 2. The heated liquid injection means 8 is attached to a support table 21 fixed to a ceiling surface 33 of the reserve heating tank 12, and is installed on a side opposed to the front surface of the workpiece 2 as well as on a side opposed to the back surface of the workpiece 2. The heated liquid injection means 8 includes a liquid injection nozzle hole 23 for injecting heated liquid. The liquid injection nozzle hole 23 is installed such that its installation angle is formed below the horizontal line. A drain port 28 is provided in the bottom portion of the reserve heating tank 12. Liquid is injected from the liquid injection nozzle hole 23 to the workpiece 2 in an obliquely downward direction from the horizontal line, and the liquid strikes on the portion (holding portion) where the workpiece 2 is held by the fixture 4. As a result, the heated liquid flows downward along the front surface of the workpiece 2 to warm the workpiece 2. Warming the workpiece in advance enables the workpiece to be heated to a predetermined temperature in a short time during the drying processing, so that the workpiece can be efficiently dried. The heated liquid is discharged from the drain port 28.

The heated liquid injection means 8 may be provided only on one of surfaces of the workpiece 2. In addition, a method for installing the heated liquid injection means 8 is not particularly limited, and the heated liquid injection means 8 may be attached to a support base fixed to an inner wall of the reserve heating tank 12. Further, while an installation angle of the liquid injection nozzle hole 23 is also not particularly limited, it is desirable to set the installation angle so that the heated liquid can be injected on an upper portion of the workpiece 2 as much as possible to preliminarily heat the whole of the workpiece 2.

In the present invention, it is only necessary that the injection means, such as the heating means 6, the gas injection means 14, the upper gas injection means 16, the lower gas injection means 17, and the heated liquid injection means 8, be provided inside each treatment tank as described above, and it does not matter whether the injection means is brought into contact with an inner wall of each treatment tank. The injection means may be held by a fixing jig such as a clamp, and the fixing jig may be attached to the inner wall, or the fixing jig may be attached to a support strut installed on a ceiling surface or a bottom surface of each treatment tank. When gas or liquid from the gas injection means 14, the upper gas injection means 16, the lower gas injection means 17, and the heated liquid injection means 8, facing each other across the workpiece 2, strikes on the workpiece 2 under uniform pressure, sway motion of the workpiece 2 can be reduced. For this reason, each injection means may be appropriately adjusted for an installation angle of the nozzle hole, a height, injection pressure, and a horizontal distance to the workpiece 2, and it is preferable to set the installation angle, the installation height, the injection pressure, and the horizontal distance, on each side, to be equal to each other to allow the workpiece 2 to be pressed under equal pressure from both sides, thereby enabling further reduction in sway motion of the workpiece 2.

Next, contents of each processing step performed in the drying apparatus 1 will be described with reference to the drawings. After the workpiece 2 is attached to the fixture 4, the workpiece 2 is conveyed from the reserve heating tank 12 to the front tank 10, the drying tank 3, and the rear tank 11 in this order by the conveying mechanism. At the time, a control unit may control conveying speed.

In the present invention, the control unit includes a CPU that performs various arithmetic processing, a memory (RAM, ROM) that stores and reads out programs, and a recording medium (such as a magnetic disk) for control programs and data. The various processing programs stored in the recording medium are read out into the memory, and the CPU controls operation and processing of each unit according to the contents of the various processing programs. Devices each requiring supply of electricity are connected to a power source (not illustrated), and necessary electric power is supplied to the devices.

Further, the conveying mechanism of the fixture 4 is controlled by a control unit (not illustrated) that is electrically connected to a motor, and the fixture 4 is moved upon receipt of an operation command from the control unit.

In the reserve heating tank 12, preheating treatment is performed by causing hot water from the heated liquid injection means 8 to strike on the workpiece 2. A liquid feed pump (not illustrated), a liquid heating means (not illustrated) such as a heater, and a liquid tank (not illustrated) are connected to the heated liquid injection means 8 through a liquid supply pipe (not illustrated). The liquid supply pump is electrically connected to a control unit (not illustrated), and a predetermined amount of liquid is supplied from the liquid supply pump in response to an operation command from the control unit, and is injected through a nozzle hole of the heated liquid injection means 8. While the liquid is not particularly limited, water is used from a viewpoint of cost. Water may be heated to a predetermined temperature (e.g., about 60° C.) by heated liquid injection means 8 provided at a predetermined place. In the reserve heating tank 12, the workpiece 2 held by the fixture 4 may be stopped for a period of time necessary for heating the workpiece 2, or may be preliminarily heated while being moved. After the preheating treatment, the workpiece 2 held by the fixture 4 is moved into the front tank 10.

In the front tank 10, gas (e.g., 75 L/min, 0.4 MPa) injected from the upper gas injection means 16 strikes on the holding portion, held by the fixture 4, in each surface of the workpiece 2. As a result, liquid removal processing of the holding portion of the workpiece 2 held by the fixture 4 is performed. The upper gas injection means 16 is connected to a gas supply pipe (not illustrated), and is connected to a gas supply pump (not illustrated) through the gas supply pipe. The gas supply pump is electrically connected to a control unit (not illustrated), so that a predetermined amount of gas is supplied to the upper gas injection means 16 from the gas supply pump in response to an operation command from the control unit, and is injected through the upper nozzle holes 20. The gas is not particularly limited, and may be air, dry air, or gas such as nitrogen, for example. From a viewpoint of cost, air is used. Air may be supplied by being taken in by the gas supply pump. The injection speed of the gas injected from the upper gas injection means 16 may be adjusted by appropriately adjusting pressure of a pump (not illustrated). For example, when a flat air nozzle with a nozzle width (e.g., about 50 mm to 200 mm), and a nozzle diameter (e.g., about 0.1 mm to 5 mm) is used, the amount of supply of gas per nozzle and pressure of the gas are about 50 L/min to 400 L/min, and about 0.2 MPa to 0.5 MPa, respectively. In the front tank 10, the workpiece 2 held by the fixture 4 may be stopped for a period of time necessary for removing liquid on the holding portion of the workpiece 2, or the liquid may be removed while the workpiece 2 is moved. After the treatment, the workpiece 2 held by the fixture 4 is moved into the drying tank 3.

In the drying tank 3, the front and back surfaces of the workpiece 2 are dried by radiant heat from each heating means 6 provided to face the corresponding one of the surfaces of the workpiece 2. In addition, air strikes from the gas injection means 14 provided to face each surface of the workpiece 2 toward the lower end portion of the workpiece 2, so that the posture is maintained and the droplets of liquid are removed. The heating means 6 is provided at its both ends with respective electrodes, and these electrodes are electrically connected to a power supply unit and a control unit, which are not illustrated. The control unit issues an operation command to the power supply unit to energize the heating means 6, so that the heating means 6 is heated to enable far infrared rays to be generated. The workpiece 2 may be thermally damaged when being overheated, and thus the heating means 6 is turned on or off by temperature control using a proportional-integral-differential controller (PID) or the like to prevent the workpiece 2 from being overheated. Specifically, when the temperature of the workpiece 2 reaches 180° C. or more, the workpiece 2 may be thermally damaged. When the temperature of the workpiece 2 is 60° C. or less, drying efficiency decreases. Thus, the temperature of the workpiece 2 is controlled so as to fall within the above range.

The gas injection means 14 is connected to a gas supply pipe (not illustrated), and is connected to a gas supply pump (not illustrated) through the gas supply pipe. The gas supply pump is electrically connected to a control unit (not illustrated), so that a predetermined amount of gas is supplied to the gas injection means 14 from the gas supply pump in response to an operation command from the control unit, and is injected through the nozzle holes 15. Injection speed of the gas can be adjusted by the pressure of a pump (not illustrated), a diameter of a tubal member (e.g., about 10 mm to 20 mm), the number of nozzle holes 15, a diameter of the nozzle hole 15 (e.g., about 1 mm to 5 mm), and the like. The amount of supply of gas injected from the gas injection means 14 and pressure of the gas may be to the extent that swinging of the workpiece 2 can be reduced, so that the amount of supply of gas and the pressure of the gas are about 100 L/min to 400 L/min per 1 m in length of the tubal member used for the gas injection means 14, and about 0.01 MPa to 0.04 MPa, respectively, for example.

The motor provided in the lifting support part 26 is electrically connected to a control unit (not illustrated). The motor is operated in response to an operation command from the control unit to drive the lifting roller (not illustrated), so that the lifting support part 26 is moved along the rail 27 to enable the gas injection means 14 to be moved to a desired position. Thus, even when the workpiece 2 is changed in size, gas can strike on the lower end portion of the workpiece 2 by moving the gas injection means 14 using the lifting mechanism.

Subsequently, the workpiece 2 held by the fixture 4 is moved into the rear tank 11. In the rear tank 11, gas (e.g., 60 L/min, 0.4 MPa) injected from the lower gas injection means 17 strikes on the lower end portion in each of the surfaces of the workpiece 2. As a result, droplets of liquid adhering to the lower end portion of the workpiece 2 are removed. Droplets of liquid on the workpiece 2 held by the fixture 4 are removed while the workpiece 2 is stopped for a predetermined time in the rear tank 11 or is not stopped therein. In addition, in the rear tank 11, gas (e.g., 75 L/min, 0.4 MPa) injected from the nipper gas injection means 16 strikes on the holding portion in each of the surfaces of the workpiece 2. As a result, the liquid remaining in the holding portion is removed. The control of the upper gas injection means 16 is identical to that in the front tank 10, so that description thereof is not duplicated. The control of the lower gas injection means is identical to the control of the gas injection means 14 in the drying tank 3, so that description thereof is not duplicated. After the treatment, the workpiece 2 held by the fixture 4 is conveyed from the rear tank 11 to the outside of the drying apparatus.

REFERENCE SIGNS LIST 1 drying apparatus
2 workpiece
3 drying tank
4 fixture
5 guide rail
6 heating means
7 conveying direction
8 heated liquid injection means
10 front tank
11 rear tank
12 reserve heating tank
13 exhaust port
14 gas injection means
15 nozzle hole
16 upper gas injection means
17 lower gas injection means
18 gas straightening plate
19 cutout
20 upper nozzle hole
21 support table
22 holding part
23 liquid injection, nozzle hole
24 fixture connection part
25 conveying roller
26 lifting support part
27 lifting rail
28 drain port
29 upper gas injection means fixing base
30 horizontal line
31 installation angle of nozzle hole
32 line passing through center of nozzle hole
33 ceiling surface of reserve heating tank

What is claimed is:

1. A drying apparatus comprising:
   a drying tank for performing drying processing of a workpiece;
   a fixture for holding the workpiece in a vertical posture;
   a heating means opposed to a front surface of the workpiece; and
   a heating means opposed to a back surface of the workpiece,
   wherein each heating means is inclined downwardly in a conveying direction of the workpiece.

2. The drying apparatus according to claim 1, wherein said drying tank includes a gas injection means opposed to the front surface of the workpiece and a gas injection means opposed to the back surface of the workpiece, wherein a nozzle hole of each gas injection means is inclined obliquely downward.

3. The drying apparatus according to claim 1, wherein said drying tank includes a conveying mechanism of the fixture.

4. The drying apparatus according to claim 2, wherein said drying tank includes an exhaust port provided in a bottom surface thereof.

5. The drying apparatus according to claim 4, wherein said drying tank includes a gas straightening plate that is provided above the exhaust port to allow gas injected through the nozzle hole to strike on the gas straightening plate.

6. The drying apparatus according to claim 5, wherein a surface of said gas straightening plate which faces the workpiece has a curved shape being convex upward.

7. The drying apparatus according to claim 2, wherein said gas injection means includes a lifting mechanism.

8. The drying apparatus according to claim 1, wherein said drying apparatus further includes:
   a front tank provided on an inlet side of the drying tank; and
   a rear tank provided on an outlet side of the drying tank, wherein the front tank and the rear tank each have a first gas injection means opposed to the front surface of the workpiece and a second gas injection means opposed to the back surface of the workpiece.

9. The drying apparatus according to claim 8, wherein said first and second gas injection means in the rear tank are provided at least at one of a position facing an upper portion of the workpiece and a position facing a lower portion thereof.

10. The drying apparatus according to claim 8, wherein said drying apparatus further includes a reserve heating tank provided on an inlet side of the front tank, wherein the reserve heating tank has heated liquid injection means.

11. The drying apparatus according to claim 1, wherein the heating means is a conductive member capable of heating by radiant heating.

12. The drying apparatus according to claim 11, wherein the conductive member is an elongated rod-shape member.

13. The drying apparatus according to claim 1, wherein said drying apparatus further includes:
   a front tank provided on an inlet side of the drying tank; and
   a rear tank provided on an outlet side of the drying tank,
   wherein the front tank has an elongated gas injector opposed to an upper portion of the front surface of the workpiece and an elongated gas injector opposed to an upper portion of the back surface of the workpiece,
   wherein the rear tank has elongated gas injectors opposed to an upper portion of the front surface of the workpiece and a lower portion of the front surface of the workpiece, respectively, and
   wherein the rear tank has elongated gas injectors opposed to an upper portion of the back surface of the workpiece and a lower portion of the back surface of the workpiece, respectively.

* * * * *